US012317603B2

(12) United States Patent
Billoint

(10) Patent No.: US 12,317,603 B2
(45) Date of Patent: May 27, 2025

(54) PROCESS FOR PROTECTING AN UPPER STAGE OF ELECTRONIC COMPONENTS OF AN INTEGRATED CIRCUIT AGAINST ANTENNA EFFECTS

(71) Applicant: Commissariat à l'Energie Atomique et aux Energies Alternatives, Paris (FR)

(72) Inventor: Olivier Billoint, Grenoble (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 62 days.

(21) Appl. No.: 17/652,166

(22) Filed: Feb. 23, 2022

(65) Prior Publication Data
US 2022/0293588 A1 Sep. 15, 2022

(30) Foreign Application Priority Data
Feb. 23, 2021 (FR) ........................... 21 01763

(51) Int. Cl.
  *H10D 89/60* (2025.01)
  *H01L 21/48* (2006.01)
  *H10D 86/00* (2025.01)

(52) U.S. Cl.
  CPC ......... *H10D 89/911* (2025.01); *H01L 21/486* (2013.01); *H10D 86/215* (2025.01); *H10D 89/611* (2025.01)

(58) Field of Classification Search
  CPC ............... H01L 27/0288; H01L 21/486; H01L 27/0255; H01L 27/1211;
(Continued)

(56) References Cited

U.S. PATENT DOCUMENTS

| 5,633,181 A | * | 5/1997 | Hayashi | ............ H01L 21/8249 438/210 |
| 5,892,260 A | * | 4/1999 | Okumura | ............ H01L 27/0218 257/351 |

(Continued)

OTHER PUBLICATIONS

French Preliminary Search Report issued Nov. 4, 2021 in French Application 21 01763 filed on Feb. 23, 2021, 14 pages (with English Translation of Categories of Cited Documents & Written Opinion).

*Primary Examiner* — Duy T Nguyen
(74) *Attorney, Agent, or Firm* — Oblon, McClelland, Maier & Neustadt, L.L.P.

(57) ABSTRACT

A process for protecting an upper stage of an electronic components against antenna effects includes providing a first structure having a first substrate with a first surface, a first stage of electronic components formed in a second surface of the first substrate, and a first stack having a last metallization level electrically connected to the second surface; and providing a second structure having a second substrate with a through-substrate via and having a second stage of electronic components having protective components that are arranged to drain electric charges to the second substrate. The process also includes joining the first and second structures so that the through-substrate via is electrically connected to the last metallization level of the first stack and forming a second stack on the second stage having a first metallization level electrically connected to the through-substrate via and to the first surface of the second substrate.

15 Claims, 2 Drawing Sheets

(58) Field of Classification Search
CPC . H01L 2224/08146; H01L 2224/80895; H01L 2224/80896; H01L 21/8221; H01L 21/823475; H01L 23/60; H01L 25/50; H01L 27/1207; H01L 2225/06524; H01L 25/0657; H01L 24/08; H01L 24/80; H01L 2225/06541; H10D 89/911; H10D 86/215; H10D 89/611; H10D 30/022; A23B 2/783; A23B 2/96; H10F 19/908; H10H 20/8314
USPC ........................................................ 438/455
See application file for complete search history.

(56) References Cited

U.S. PATENT DOCUMENTS

| | | | | |
|---|---|---|---|---|
| 7,943,428 | B2* | 5/2011 | Gambino | H01L 23/473 |
| | | | | 438/455 |
| 8,421,193 | B2* | 4/2013 | Huang | H01L 24/92 |
| | | | | 438/455 |
| 9,431,441 | B1* | 8/2016 | Zhou | H01L 27/14636 |
| 2002/0109153 | A1* | 8/2002 | Ker | H01L 29/7391 |
| | | | | 257/199 |
| 2007/0269978 | A1* | 11/2007 | Shih | H01L 21/76865 |
| | | | | 257/E21.309 |
| 2010/0032808 | A1* | 2/2010 | Ding | H01L 25/0657 |
| | | | | 257/E21.597 |
| 2010/0314711 | A1 | 12/2010 | Farooq et al. | |
| 2011/0095367 | A1 | 4/2011 | Su et al. | |
| 2011/0291194 | A1 | 12/2011 | Kim | |
| 2012/0299200 | A1* | 11/2012 | Farooq | H01L 25/0657 |
| | | | | 257/777 |
| 2014/0098448 | A1* | 4/2014 | Henderson | H01L 23/60 |
| | | | | 438/601 |
| 2014/0353839 | A1 | 12/2014 | Lin et al. | |
| 2015/0021785 | A1 | 1/2015 | Lin | |
| 2015/0279881 | A1* | 10/2015 | Shizukuishi | H01L 23/60 |
| | | | | 438/67 |
| 2015/0294963 | A1* | 10/2015 | Lin | H01L 25/50 |
| | | | | 438/107 |
| 2015/0348842 | A1 | 12/2015 | Lin et al. | |
| 2016/0172403 | A1* | 6/2016 | Wu | B24B 7/228 |
| | | | | 257/459 |
| 2017/0125455 | A1 | 5/2017 | Okamoto et al. | |

* cited by examiner

PROCESS FOR PROTECTING AN UPPER STAGE OF ELECTRONIC COMPONENTS OF AN INTEGRATED CIRCUIT AGAINST ANTENNA EFFECTS

TECHNICAL FIELD

The invention relates to the technical field of fabrication of a plurality of stages of electronic components of an integrated circuit, with VLSI 3D integration (VLSI being the acronym of Very-Large-Scale Integration).

The invention is notably applicable to the CoolCube™ technology.

PRIOR ART

As illustrated in FIG. 1, antenna effects are effects that cause degradation of a stage of electronic components C (formed in the upper surface of a substrate $S_0$) during an etch in a plasma P, after fabrication of a first metallization level $M_1$ on the stage of electronic components C. The etch in the plasma P requires a biasing electrode $E_1$, which is electrically connected to the lower surface of the substrate $S_0$, and a ground electrode $E_2$. Antenna effects affect electronic components C comprising an oxide layer Ox, for example MOS transistors (as illustrated in FIG. 1 with a source S, a gate G, and a drain D) or oxide-based resistive memories. More precisely, the etch in the plasma P will electrically charge the metal surface of the first metallization level $M_1$ on application of a potential difference between the biasing electrode $E_1$ and the ground electrode $E_2$. Now, the metal surface of the first metallization level $M_1$ is electrically connected to the oxide layer Ox. Thus, electric charges will accumulate and eventually damage the oxide layer Ox, most particularly when the oxide layer Ox is thin.

To mitigate this problem, three main solutions are known in the prior art:

(i) using a dummy transistor, formed in the upper surface of the substrate $S_0$, and electrically connected to the first metallization level $M_1$ so that electric charges are drained to the substrate $S_0$ and then to the biasing electrode $E_1$;

(ii) using a p-n junction formed in a surface region of the substrate $S_0$, which is electrically connected to the first metallization level $M_1$, and reverse biased so that electric charges are drained to the substrate $S_0$ and then to the biasing electrode $E_1$;

(iii) using metal hops during a sequential fabrication of the first metallization level $M_1$ in order to decrease the area of its metal surface and thus decreases accumulation of electric charges on the metal surface, which will therefore reduce the voltage across the terminals of the oxide layer Ox.

These prior-art solutions do not provide entirely satisfactory protection of the upper stage of electronic components C against antenna effects, in the case of 3D integration. Specifically, solutions (i) and (ii) do not allow electric charges to be effectively drained to the upper substrate and then to the biasing electrode $E_1$. Solution (iii) requires, for its part, vast resources in terms of interconnect lines, and it is therefore not desirable for VLSI.

SUMMARY OF THE INVENTION

The invention aims to completely or partially remedy the aforementioned drawbacks. To this end, the subject of the invention is a process for protecting an upper stage of electronic components of an integrated circuit against antenna effects, comprising the steps:

a) providing a first structure comprising in succession:
  a first semiconductor substrate having first and second opposite surfaces, the first surface of the first substrate being intended to be electrically connected to a biasing electrode,
  a first stage of electronic components, this first stage being formed in the second surface of the first substrate,
  a first stack of metallization levels, this first stack of metallization levels being arranged to electrically connect the electronic components of the first stage and having a last metallization level electrically connected to the second surface of the first substrate;

b) providing a second structure comprising:
  a second semiconductor substrate having first and second opposite surfaces, the second substrate comprising a through-substrate via,
  a second stage of electronic components, this second stage being formed in the first surface of the second substrate and comprising protective components arranged to drain electric charges to the second substrate;

c) joining the first and second structures so that the second surface of the second substrate is oriented towards the first stack of metallization levels, and so that the through-substrate via is electrically connected to the last metallization level of the first stack;

d) forming a second stack of metallization levels, this second stack of metallization levels being arranged to electrically connect the electronic components of the second stage; step d) being executed so that the second stack has a first metallization level electrically connected to the through-substrate via and to the first surface of the second substrate.

In other words, step a) is executed so that the first stack of metallization levels has a last metallization level comprising a pattern electrically connected to the second surface of the first substrate.

In other words, step b) is executed so that the second stage comprises: electronic components, to be protected against antenna effects;
  protective components, which are distinct from the electronic components to be protected against antenna effects, and which are arranged to drain electric charges to the second substrate.

In other words, the electronic components of the second stage and the protective components of the second stage are distinct entities, which cannot be confused. Each protective component is not an integral part of an electronic component to be protected against antenna effects.

In other words, step c) is executed so that the through-substrate via is electrically connected to the pattern of the last metallization level of the first stack.

In other words, step d) is executed so that the second stack of metallization levels has a first metallization level comprising a pattern electrically connected to the through-substrate via and to the first surface of the second substrate.

Step d) uses a plasma etch. Step d) is executed after step c).

Definitions

By "substrate", what is meant is a self-supporting physical carrier made of a base material from which an electronic component may be formed. A substrate is conventionally a wafer cut from a single-crystal semiconductor ingot.

By "semiconductor", what is meant is that the substrate has a conductivity at 300 K comprised between $10^{-8}$ S/cm and $10^3$ S/cm.

By "formed in the surface", what is meant is that the electronic components are formed on and/or through the surface.

By "metallization levels", what is meant is metal tracks, embedded in a dielectric material, forming an interconnect structure. Each metallization level comprises interconnect lines (routing lines) that are electrically insulated from one another. It is thus possible to consider that each metallization level comprises patterns that are electrically insulated from one another (i.e. mutually).

By "stack", what is meant is a succession of metallization levels in a vertical direction (i.e. normal to the surfaces of the first and second substrates).

By "last metallization level", what is meant is the metallization level of the stack formed last, conventionally at the back end of line, corresponding to the highest metallization level of the stack.

By "first metallization level", what is meant is the metallization level of the stack formed first, conventionally at the back end of line, corresponding to the lowest metallization level of the stack.

By "via", what is meant is a metallized hole allowing an electrical connection to be made. A through-substrate via extends vertically between the first and second surfaces of the second substrate so as to establish an electrical connection between said surfaces. In the case where the second substrate is made of silicon, the through-substrate via is a TSV (TSV being the acronym of through-silicon via).

Thus, such a process according to the invention allows electric charges present on the metal surface of the first (and subsequent) metallization level(s) of the second stack to be effectively drained, during a plasma etch, by creating a weakly resistive path to the first surface of the first substrate, and therefore to the biasing electrode. More precisely, the electric charges present on the metal surface of the first metallization level of the second stack will be drained in succession:
  to the second substrate via the protective components, then
  to the through-substrate via the first surface of the second substrate (by way of the first metallization level of the second stack, i.e. by way of the pattern of the first metallization level of the second stack electrically connected to the through-substrate via and to the first surface of the second substrate), then
  to the last metallization level of the first stack (i.e. to the pattern of the last metallization level of the first stack electrically connected to the through-substrate via and to the second surface of the first substrate), then
  to the second surface of the first substrate, and lastly
  to the first surface of the first substrate (and therefore to the biasing electrode).

The process according to the invention may comprise one or more of the following features.

According to one feature of the invention, step b) is executed so that the second substrate is doped a first conductivity type; step b) comprises a step $b_3$) consisting in forming a first doped region, of a second conductivity type, in the first surface of the second substrate so as to form a p-n junction; the p-n junction being intended to be reverse biased so as to obtain a protective component; and step d) is executed so that the first metallization level of the second stack is electrically connected to the first doped region formed in step $b_3$).

In other words, step d) is executed so that the pattern of the first metallization level of the second stack is electrically connected to the first doped region formed in step $b_3$).

Definition

The term "doped" indicates the presence of impurities (species), that, introduced into a semiconductor matrix, donate an electron to the conduction band (n-type dopants) or accept an electron from the conduction band (p-type dopants).

The expression "second conductivity type" designates a conductivity type opposite to the first conductivity type.

One advantage of such a p-n junction is that it makes it possible to drain electric charges present on the metal surface of the first metallization level of the second stack to the second substrate.

According to one feature of the invention, step b) comprises a step $b'_3$) consisting in forming a MOS capacitor in the first surface of the second substrate so as to obtain a protective component; and step d) is executed so that the first metallization level of the second stack is electrically connected to the MOS capacitor formed in step $b'_3$).

In other words, step d) is executed so that the pattern of the first metallization level of the second stack is electrically connected to the MOS capacitor formed in step $b'_3$).

Definition

By "MOS" what is meant is a metal-oxide-semiconductor structure.

One advantage of such a MOS capacitor is that it makes it possible to drain electric charges present on the metal surface of the first metallization level of the second stack to the second substrate. Furthermore, a MOS capacitor possesses a higher leakage current than a reverse biased p-n junction of equal size, this allowing the effectiveness of drainage of the electric charges present on the metal surface of the first metallization level of the second stack to be improved.

According to one feature of the invention, step a) is executed so that:
  the first substrate is doped a first conductivity type,
  a highly doped region, of the first conductivity type or of a second conductivity type, is formed in the second surface of the first substrate,
  the last metallization level of the first stack is electrically connected to the highly doped region.

In other words, step a) is executed so that the pattern of the last metallization level of the first stack is electrically connected to the highly doped region.

Definition

By "highly doped", what is meant is that the dopants of the highly doped region have a concentration at least 10 times higher than the concentration of the dopants of the first substrate.

One advantage thereof is that:
  it is either possible to form a weakly resistive electrical contact between the first and second substrates when the highly doped region is doped the first conductivity type, and to drain electric charges from the second surface of the first substrate to the first surface of the first substrate;
  or it is possible to bias the first and second substrates to different electrical potentials when the highly doped region is doped the second conductivity type, while permitting drainage of electric charges from the second surface of the first substrate to the first surface of the first substrate; the highly doped region of the second conductivity type forms a p-n junction, which is intended to be reverse biased, so as to electrically insulate the first and second substrates; the leakage current of the reverse biased p-n junction allows electric charges to be drained from the second surface of the first substrate to the first surface of the first substrate.

According to one feature of the invention, steps a) and b) are executed so that the electronic components of the first and second stages, with the exception of the protective components, are chosen from:
MOS field-effect transistors formed on a bulk substrate,
MOS field-effect transistors formed on an SOI substrate,
MOS fin field-effect transistors formed on a bulk substrate,
MOS fin field-effect transistors formed on an SOI substrate, and oxide-based resistive memories.

Definitions

By "bulk substrate", what is meant is a substrate possessing a single constituent material.

By "SOI", what is meant is silicon-on-insulator, i.e. a substrate of silicon/insulator/silicon type.

The term "substrate" designates the first substrate (the second substrate, respectively) when it is a question of an electronic component of the first stage (of the second stage, respectively).

Thus, such electronic components are particularly subject to antenna effects because of the presence of a thin oxide layer.

According to one feature of the invention, steps a) and b) are executed so that the first and second substrates are silicon wafers.

According to one feature of the invention, step a) comprises the steps:
$a_1$) providing the first semiconductor substrate having first and second opposite surfaces, the first surface of the first substrate being intended to be electrically connected to a biasing electrode;
$a_2$) forming the first stage of electronic components in the second surface of the first substrate; step $a_2$) being executed at the front end of line;
$a_3$) forming the first stack of metallization levels, this first stack of metallization levels being arranged to electrically connect the electronic components of the first stage and having a last metallization level electrically connected to the second surface of the first substrate; step $a_3$) being executed at the back end of line.

In other words, step $a_3$) is executed so that the first stack of metallization levels has a last metallization level comprising a pattern electrically connected to the second surface of the first substrate.

Definition

The expression "front end of line" is conventionally designated by the acronym FEOL.

According to one feature of the invention, step b) comprises the steps:
$b_1$) providing the second semiconductor substrate having first and second opposite surfaces, the second substrate comprising a through-substrate via;
$b_2$) forming the second stage of electronic components in the first surface of the second substrate; step $b_2$) being executed at the front end of line.

According to one feature of the invention, step d) is carried out at the back end of line.

According to one feature of the invention, step c) is executed via molecular bonding of the first and second structures by way of the least one oxide layer.

Definition

By "molecular bonding", what is meant is spontaneous bonding that results from direct contact between two surfaces, i.e. in the absence of an additional element such as an adhesive, a wax or a solder. The bonding is mainly the result of van der Waals forces resulting from the electronic interaction between the atoms or molecules of two surfaces, hydrogen bonds due to surface preparations or covalent bonds formed between the two surfaces.

According to one feature of the invention, step b) is executed so that the second substrate is doped a first conductivity type; step b) comprises a step $b_4$) consisting in forming a highly doped second doped region of the first conductivity type, in the first surface of the second substrate; and step d) is executed so that the first metallization level of the second stack is electrically connected to the second doped region formed in step $b_4$).

In other words, step d) is executed so that the pattern of the first metallization level of the second stack is electrically connected to the second doped region formed in step $b_4$).

One advantage thereof is to create an electrical connection between the through-substrate via and the first surface of the second substrate, by way of the first metallization level of the second stack (i.e. by way of the pattern of the first metallization level of the second stack).

BRIEF DESCRIPTION OF THE DRAWINGS

Other features and advantages will become apparent from the detailed description of various embodiments of the invention, the description containing examples and references to the appended drawings.

Figure 1:
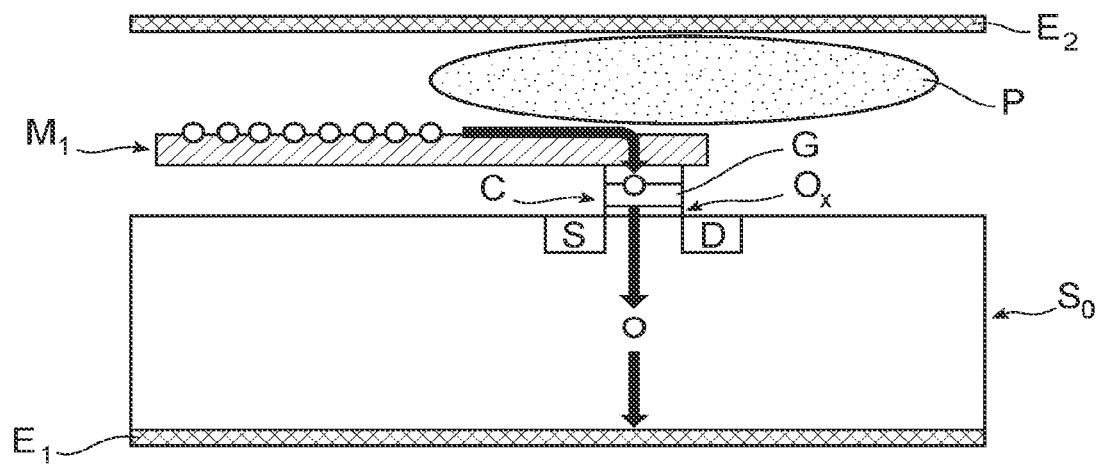
FIG. 1 (already described) is a schematic cross-sectional view of a substrate comprising a stage of electronic components, illustrating antenna effects.

Moreover, it should be noted that, for the sake of legibility and ease of understanding, the drawings described above are schematic, and not to scale. The cross sections are cut normal to the surfaces of the substrates.

DETAILED DESCRIPTION OF EMBODIMENTS

For the sake of simplicity, elements that are identical or that perform the same function in the various embodiments have been designated with the same references.

One subject of the invention is a process for protecting an upper stage TT of electronic components C of an integrated circuit against antenna effects, comprising the steps:

a) providing a first structure comprising in succession:
a first semiconductor substrate 1 having first and second opposite surfaces 10, 11, the first surface 10 of the first substrate 1 being intended to be electrically connected to a biasing electrode $E_1$,
a first stage BT of electronic components C, this first stage being formed in the second surface 11 of the first substrate 1,
a first stack of metallization levels, this first stack of metallization levels being arranged to electrically connect the electronic components C of the first stage BT and having a last metallization level $M_N$ electrically connected to the second surface 11 of the first substrate 1;

b) providing a second structure comprising:
a second semiconductor substrate 2 having first and second opposite surfaces 20, 21, the second substrate 2 comprising a through-substrate via 22, a second stage TT of electronic components C, this second stage being formed in the first surface 20 of the second substrate 2 and comprising protective components 200; 3 arranged to drain electric charges to the second substrate 2;

c) joining the first and second structures so that the second surface 21 of the second substrate 2 is oriented towards the first stack of metallization levels, and so that the through-substrate via 22 is electrically connected to the last metallization level $M_N$ of the first stack;

d) forming a second stack of metallization levels, this second stack of metallization levels being arranged to electrically connect the electronic components C of the second stage TT; step d) being executed so that the second stack has a first metallization level $M_1$ electrically connected to the through-substrate via 22 and to the first surface 20 of the second substrate 2.

In other words, step a) is executed so that the first stack of metallization levels has a last metallization level $M_N$ comprising a pattern electrically connected to the second surface 11 of the first substrate 1.

In other words, step b) is executed so that the second stage TT comprises: electronic components C, to be protected against antenna effects;
protective components 200; 3, which are distinct from the electronic components C to be protected against antenna effects, and which are arranged to drain electric charges to the second substrate 2.

In other words, the electronic components C of the second stage TT and the protective components 200; 3 of the second stage TT are distinct entities, which cannot be confused. Each protective component 200; 3 is not an integral part of an electronic component C to be protected against antenna effects.

In other words, step c) is executed so that the through-substrate via 22 is electrically connected to the pattern of the last metallization level $M_N$ of the first stack.

In other words, step d) is executed so that the second stack of metallization levels has a first metallization level $M_1$ comprising a pattern electrically connected to the through-substrate via 22 and to the first surface 20 of the second substrate 2.

Step d) uses a plasma etch. Step d) is executed after step c).

Figure 2:
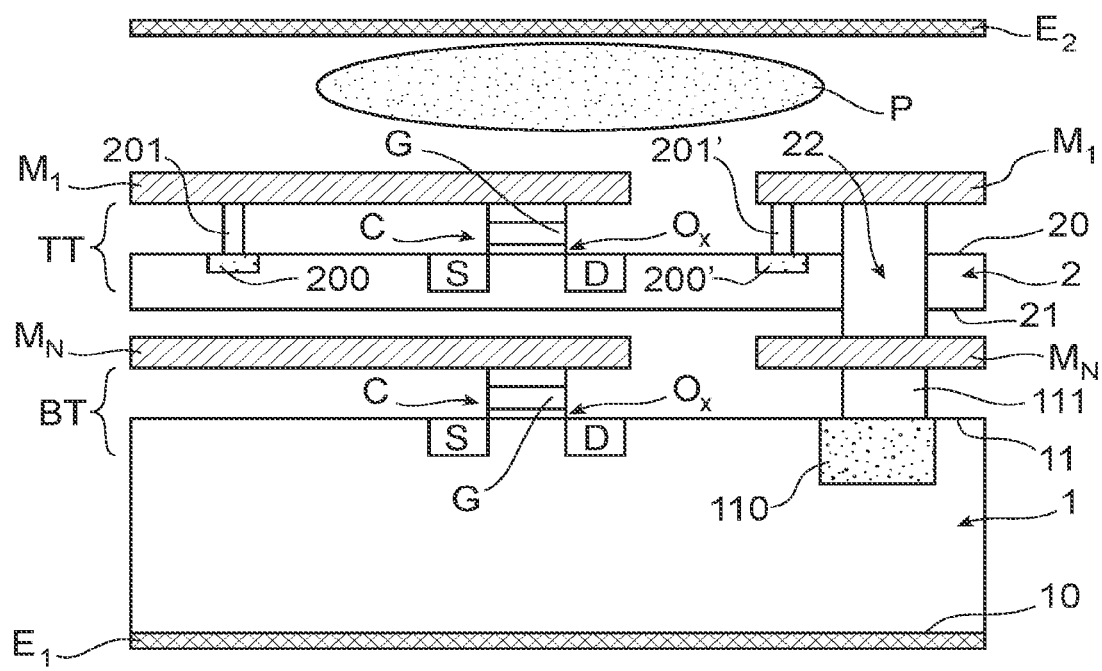
FIG. 2 is a partial schematic cross-sectional view of an assembly of first and second structures in which the first metallization level of the second stack has been constructed, and illustrating a first mode of implementation of a process according to the invention. It will be noted that only the last metallization level of the first stack has been shown for the sake of simplicity. The dielectric material in which the stacks of metallization levels are embedded has not been shown for the sake of legibility.
Figure 3:
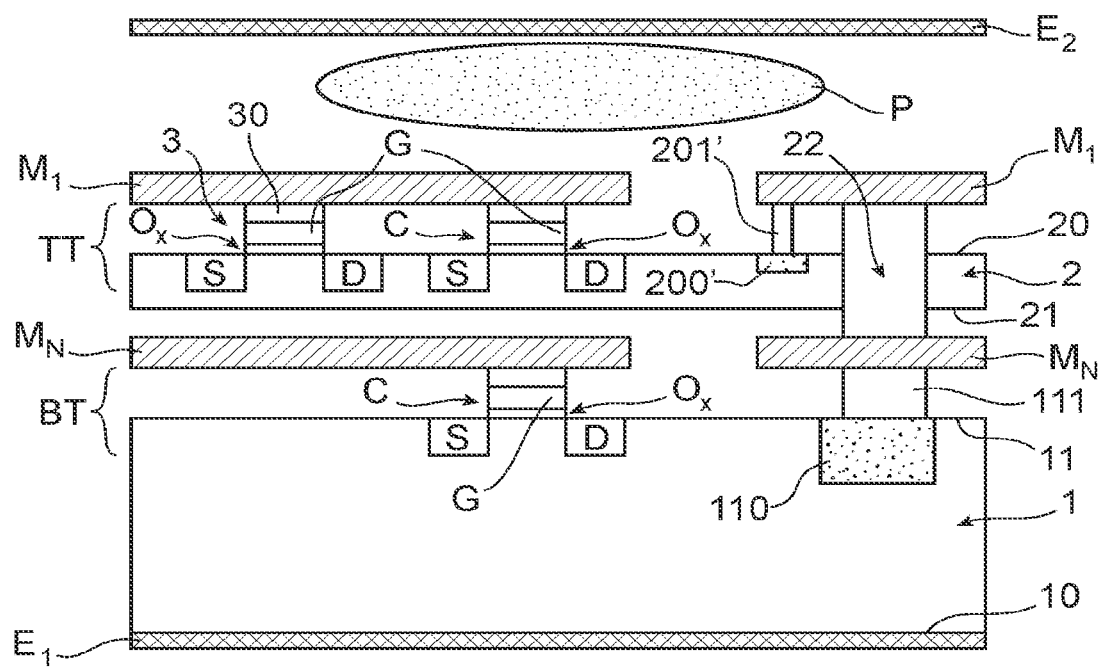
FIG. 3 is a partial schematic cross-sectional view of an assembly of first and second structures in which the first metallization level of the second stack has been constructed, and illustrating a second mode of implementation of a process according to the invention. It will be noted that only the last metallization level of the first stack has been shown for the sake of simplicity. The dielectric material in which the stacks of metallisation levels are embedded has not been shown for the sake of legibility.

The assembly of the first and second structures with the first metallization level $M_1$ of the second stack formed is illustrated in FIGS. 2 and 3.

Step a)

The first substrate 1 of the first structure provided in step a) is advantageously doped a first conductivity type, and preferably doped p-type. The first substrate 1 may have a thickness comprised between 10 µm and several hundred µm (500 µm for example).

The first stack of metallization levels may have a thickness comprised between 100 nm and 200 nm. In a 28 nm technology (i.e. when the electronic components C are transistors with a gate length of 28 nm) with 11 metallization levels, the first stack of metallization levels may have a thickness of the order of 4.5 µm.

Step a) is advantageously executed so that:
the first substrate 1 is doped a first conductivity type,
a highly doped region 110, of the first conductivity type or of a second conductivity type, is formed in the second surface 11 of the first substrate 1, the last metallization level $M_N$ of the first stack is electrically connected to the highly doped region 110, for example using a via 111.

In other words, step a) is executed so that the pattern of the last metallization level $M_N$ of the first stack is electrically connected to the highly doped region 110.

Step a) is advantageously executed so that the electronic components C of the first stage BT, with the exception of the protective components 200; 3, are chosen from:
MOS field-effect transistors formed on a bulk substrate 1, 2,
MOS field-effect transistors formed on an SOI substrate 1, 2,
MOS fin field-effect transistors formed on a bulk substrate 1, 2,
MOS fin field-effect transistors formed on an SOI substrate 1, 2, and oxide-based resistive memories.

A single electronic component C is illustrated in FIGS. 2 and 3, for the sake of legibility; it is a MOS field-effect transistor comprising a source S, a gate G, a drain D and an oxide layer Ox, and is formed on the first bulk substrate 1.

Step a) is advantageously executed so that the first substrate 1 is a silicon wafer. The first substrate 1 may be an SOI substrate.

Step a) advantageously comprises the steps:
$a_1$) providing the first semiconductor substrate 1 having first and second opposite surfaces 10, 11, the first surface 10 of the first substrate 1 being intended to be electrically connected to a biasing electrode $E_1$;
$a_2$) forming the first stage BT of electronic components C in the second surface 11 of the first substrate 1; step $a_2$) being executed at the front end of line;
$a_3$) forming the first stack of metallization levels, this first stack of metallization levels being arranged to electrically connect the electronic components C of the first stage BT and having a last metallization level $M_N$ electrically connected to the second surface 11 of the first substrate 1; step $a_3$) being executed at the back end of line.

In other words, step $a_3$) is executed so that the first stack of metallization levels has a last metallization level $M_N$ comprising a pattern electrically connected to the second surface 11 of the first substrate 1.

Step b)

The second substrate 2 of the second structure provided in step b) is advantageously doped a first conductivity type, and preferably doped p-type. The second substrate 2 has a thickness strictly less than the thickness of the first substrate 1. The second substrate 2 advantageously has a thickness smaller than 1 μm.

Step b) is advantageously executed so that the electronic components C of the second stage TT, with the exception of the protective components 200; 3, are chosen from:
- MOS field-effect transistors formed on a bulk substrate 1, 2,
- MOS field-effect transistors formed on an SOI substrate 1, 2,
- MOS fin field-effect transistors formed on a bulk substrate 1, 2,
- MOS fin field-effect transistors formed on an SOI substrate 1, 2, and oxide-based resistive memories.

A single electronic component C is illustrated in FIGS. 2 and 3, for the sake of legibility; it is a MOS field-effect transistor comprising a source S, a gate G, a drain D and an oxide layer Ox, and is formed on the second bulk substrate 2.

Step b) is advantageously executed so that the second substrate 2 is a silicon wafer. The second substrate 2 may be an SOI substrate.

Step b) is executed so that the through-substrate via 22 lies facing a free region of the second surface 21 of the second substrate 2, i.e. a region of the second surface 21 of the second substrate that is not covered with electronic components C.

Step b) advantageously comprises the steps:
- $b_1$) providing the second semiconductor substrate 2, which has first and second opposite surfaces 20, 21, the second substrate 2 comprising a through-substrate via 22,
- $b_2$) forming the second stage TT of electronic components C in the first surface 20 of the second substrate 2; step $b_2$) being executed at the front end of line.

In one mode of implementation, illustrated in FIG. 2, when step b) is executed so that the second substrate 2 is doped a first conductivity type, step b) advantageously comprises a step $b_3$) consisting in forming a first doped region 200, of a second conductivity type, in the first surface 20 of the second substrate 2 so as to form a p-n junction. The p-n junction is intended to be reverse biased so as to obtain a protective component 200.

According to one alternative mode of implementation, illustrated in FIG. 3, step b) comprises a step $b'_3$) consisting in forming a MOS capacitor 3 in the first surface 20 of the second substrate 2 so as to obtain a protective component 3. A MOS capacitor 3 comprises a transistor structure in which the source S, the drain D and the second substrate 2 are connected together.

When step b) is executed so that the second substrate 2 is doped the first conductivity type, step b) advantageously comprises a step $b_4$) consisting in forming a highly doped second doped region 200' of the first conductivity type, in the first surface 20 of the second substrate 2.

Step c)

Step c) is advantageously executed via molecular bonding of the first and second structures by way of the least one oxide layer (not illustrated). The one or more oxide layers may be made of $SiO_2$.

Step d)

Step d) is executed so that the first metallization level $M_1$ of the second stack comprises a first set of interconnect lines (routing lines) arranged to electrically connect the electronic components C of the second stage TT. Step d) is executed so that the first metallization level $M_1$ of the second stack comprises a second set of interconnect lines (routing lines) arranged to electrically connect the through-substrate via 22 and the first surface 20 of the second substrate 2. The first and second sets of interconnect lines are electrically insulated from each other. The interconnect lines of the first set are electrically insulated from one another so as to not short-circuit the electronic components C.

As illustrated in FIG. 2, when step b) comprises the step $b_3$) consisting in forming the first doped region 200, of a second conductivity type, in the first surface 20 of the second substrate 2 so as to form the p-n junction, then step d) is executed so that the first metallization level $M_1$ of the second stack is electrically connected to the first doped region 200 formed in step $b_3$), for example using a via 201. In other words, step d) is executed so that the pattern of the first metallization level $M_1$ of the second stack is electrically connected to the first doped region 200 formed in step $b_3$).

As illustrated in FIG. 3, when step b) comprises the step $b'_3$) consisting in forming the MOS capacitor 3 in the first surface 20 of the second substrate 2, then step d) is executed so that the first metallization level $M_1$ of the second stack is electrically connected to the MOS capacitor 3 formed in step $b'_3$), for example using a via 30. In other words, step d) is executed so that the pattern of the first metallization level $M_1$ of the second stack is electrically connected to the MOS capacitor 3 formed in step $b'_3$).

When step b) comprises the step $b_4$) consisting in forming the highly doped second doped region 200', of the first conductivity type, in the first surface 20 of the second substrate 2, then step d) is executed so that the first metallization level $M_1$ of the second stack is electrically connected to the second doped region 200' formed in step $b_4$), for example using a via 201'. In other words, step d) is executed so that the pattern of the first metallization level $M_1$ of the second stack is electrically connected to the second doped region 200' formed in step $b_4$).

Step d) is advantageously executed at the back end of line. The second stack of metallization levels may have a thickness comprised between 100 nm and 200 nm. In a 28 nm technology (i.e. when the electronic components C are transistors with a gate length of 28 nm) with 11 metallization levels, the second stack of metallization levels may have a thickness of the order of 4.5 μm.

The invention is not limited to the disclosed embodiments. Anyone skilled in the art will be able to consider the technically workable combinations thereof, and to substitute equivalents therefor.

The invention claimed is:

1. A process for protecting an upper stage of electronic components of an integrated circuit against antenna effects, comprising steps of:
   a) providing a first structure comprising in succession:
      a first semiconductor substrate having first and second opposite surfaces, the first surface of the first substrate being configured to be electrically connected to a biasing electrode,
      a first stage of electronic components formed in the second surface of the first substrate, and
      a first stack of metallization levels arranged to electrically connect the electronic components of the first stage and having a last metallization level comprising a pattern electrically connected to the second surface of the first substrate;

b) providing a second structure comprising:
a second semiconductor substrate made of semiconductor material, the semiconductor material having first and second opposite surfaces, the second substrate comprising a through-substrate via, and
a second stage of electronic components formed in the first surface of the semiconductor material of the second substrate and comprising protective components that are formed in the first surface of the semiconductor material of the second substrate, distinct from the electronic components and arranged to drain electric charges to the second substrate;

c) joining the first and second structures so that the second surface of the semiconductor material of the second substrate is oriented towards the first stack of metallization levels, and so that the through-substrate via is electrically connected to the pattern of the last metallization level of the first stack; and d) forming a second stack of metallization levels arranged to electrically connect the electronic components of the second stage, wherein
step d) is executed so that the second stack has a first metallization level comprising a pattern electrically connected to the through-substrate via and to the first surface of the second substrate, and
step d) is executed after step c).

2. The process according to claim 1, wherein
step b) is executed so that the second substrate is doped a first conductivity type;
step b) comprises a step $b_1$) of forming a first doped region of a second conductivity type in the first surface of the second substrate so as to form a p-n junction, the p-n junction being configured to be reverse biased so as to obtain one of the protective components; and
step d) is executed so that the pattern of the first metallization level of the second stack is electrically connected to the first doped region formed in step $b_1$).

3. The process according to claim 1, wherein
step b) comprises a step $b'_1$) of forming a MOS capacitor in the first surface of the semiconductor material of the second substrate so as to obtain one of the protective components; and
step d) is executed so that the pattern of the first metallization level of the second stack is electrically connected to the MOS capacitor.

4. The process according to claim 1, wherein step a) is executed so that:
the first substrate is doped a first conductivity type,
a highly doped region of the first conductivity type or of a second conductivity type is formed in the second surface of the first substrate, and
the pattern of the last metallization level of the first stack is electrically connected to the highly doped region.

5. The process according to claim 1, wherein steps a) and b) are executed so that the electronic components of the first and second stages, with the exception of the protective components, are chosen from:
MOS field-effect transistors formed on a bulk substrate,
MOS field-effect transistors formed on an SOI substrate,
MOS fin field-effect transistors formed on a bulk substrate,
MOS fin field-effect transistors formed on an SOI substrate, and
oxide-based resistive memories.

6. The process according to claim 1, wherein steps a) and b) are executed so that the first and second substrates are silicon wafers.

7. The process according to claim 1, wherein step a) comprises steps of:
$a_1$) providing the first semiconductor substrate having first and second opposite surfaces, the first surface of the first substrate being configured to be electrically connected to the biasing electrode;
$a_2$) forming the first stage of electronic components in the second surface of the first substrate, step $a_2$) being executed at a front end of line; and
$a_3$) forming the first stack of metallization levels, the first stack of metallization levels being arranged to electrically connect the electronic components of the first stage and having the last metallization level comprising the pattern electrically connected to the second surface of the first substrate, step $a_3$) being executed at a back end of line.

8. The process according to claim 1, wherein step b) comprises a step of:
$b_1$) forming the second stage of electronic components in the first surface of the semiconductor material of the second substrate, step $b_1$) being executed at a front end of line.

9. The process according to claim 1 wherein step d) is executed at a back end of line.

10. The process according to claim 1, wherein step c) is executed via molecular bonding of the first and second structures by way of at least one oxide layer.

11. The process according to claim 1, wherein
step b) is executed so that the second substrate is doped a first conductivity type;
step b) comprises a step $b_1$) of forming a highly doped second doped region of the first conductivity type in the first surface of the semiconductor material of the second substrate; and
step d) is executed so that the pattern of the first metallization level of the second stack is electrically connected to the second doped region.

12. The process according to claim 1, wherein
the second semiconductor substrate made of the semiconductor material, and
the through-substrate via passes through the semiconductor material.

13. The process according to claim 1, wherein, in the second substrate, the electronic components and the protective components are connected to the first surface.

14. The process according to claim 1, wherein the protective components are formed of a semiconductor material.

15. The process according to claim 1, wherein one of the protective components is formed of a semiconductor region connected to the first surface of the semiconductor material of the second substrate, doped oppositely to that of the second substrate, and directly connected to the through-substrate via.

* * * * *